(12) United States Patent
Sasaoka

(10) Patent No.: US 7,030,634 B2
(45) Date of Patent: Apr. 18, 2006

(54) CHARACTERISTIC MEASURING APPARATUS FOR ELECTRONIC COMPONENTS

(75) Inventor: Yoshikazu Sasaoka, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/486,380

(22) PCT Filed: Mar. 11, 2003

(86) PCT No.: PCT/JP03/02826

§ 371 (c)(1),
(2), (4) Date: Feb. 10, 2004

(87) PCT Pub. No.: WO03/091739

PCT Pub. Date: Nov. 6, 2003

(65) Prior Publication Data

US 2004/0217764 A1  Nov. 4, 2004

(30) Foreign Application Priority Data

Apr. 25, 2002  (JP) ............................. 2002-123710

(51) Int. Cl.
*G01R 31/02* (2006.01)
*B07C 5/00* (2006.01)

(52) U.S. Cl. .................. 324/757; 324/758; 324/158.1; 209/573

(58) Field of Classification Search ........ 324/754–765, 324/158.1, 770; 209/571, 573–574
See application file for complete search history.

(56) References Cited

U.S. PATENT DOCUMENTS

| | | | | |
|---|---|---|---|---|
| 5,034,749 A | * | 7/1991 | Jungblut et al. | 324/758 |
| 5,842,579 A | * | 12/1998 | Garcia et al. | 209/573 |
| 6,040,705 A | * | 3/2000 | Garcia et al. | 324/762 |
| 6,204,464 B1 | * | 3/2001 | Garcia et al. | 209/574 |
| 6,479,777 B1 | * | 11/2002 | Yamakawa | 209/574 |
| 6,714,028 B1 | * | 3/2004 | Garcia et al. | 324/754 |

FOREIGN PATENT DOCUMENTS

| | | |
|---|---|---|
| JP | 02-195272 | 8/1990 |
| JP | 08-122386 | 5/1996 |
| JP | 2000-501174 | 2/2000 |
| WO | WO 01/10575 A1 | 2/2001 |

OTHER PUBLICATIONS

Official Communication issued in the corresponding Korean Application No. 10-2004-7004210 dated Oct. 31, 2005, Total 5 pages.

* cited by examiner

*Primary Examiner*—Paresh Patel
(74) *Attorney, Agent, or Firm*—Keating & Bennett, LLP

(57) ABSTRACT

An apparatus for measuring the electrical characteristic of a chip-shaped electronic component having first and second external terminal electrodes at first and second opposing ends thereof includes a holder that holds an electronic component with the first and second external terminal electrodes pointing toward first and second open ends of a receiving cavity. The holder is provided with a shield layer extending between first and second measuring terminals, and the shield layer is electrically connected to a measurement reference potential. The shield layer reduces the stray parasitic capacitance adjacent to the electronic component, and reduces measurement errors resulting from size variations of the electronic component.

24 Claims, 4 Drawing Sheets

CHARACTERISTIC MEASURING APPARATUS FOR ELECTRONIC COMPONENTS

BACKGROUND OF THE INVENTION

1. Field of the Invention

The present invention relates to a characteristic measuring apparatus for electronic components, and more particularly, to an improvement to a structure of a holder for holding electronic components to be tested for the electrical characteristic.

2. Description of the Related Art

U.S. Pat. No. 5,842,579 discloses a known electronic-component characteristic measuring apparatus that is relevant to the present invention. FIG. 9 schematically shows the principal part of the known electronic-component characteristic measuring apparatus.

Referring to FIG. 9, a characteristic measuring apparatus 1 is used to measure the characteristic of a chip-shaped electronic component 4 having first and second external terminal electrodes 2 and 3 at first and second opposing ends thereof.

The characteristic measuring apparatus 1 includes a holder 8 that has a receiving cavity 5 for receiving an electronic component 4 and that holds the electronic component 4 with the first and second external terminal electrodes 2 and 3 pointing toward first and second opposing open ends 6 and 7 of the receiving cavity 5.

The characteristic measuring apparatus 1 also includes first and second measuring terminals 9 and 10 disposed at the first and second open ends 6 and 7 of the receiving cavity 5 so as to be in contact with the first and second external terminal electrodes 2 and 3 of the electronic component 4. The first measuring terminal 9 is made of, for example, a leaf spring to be in elastic contact with the first external terminal electrode 2. The second measuring terminal 10 is shaped like, for example, a block, and is fixedly provided.

The holder 8 is normally shaped like a disk, and a plurality of receiving cavities 5 are distributed in the circumferential direction therein. Each of the receiving cavities 5 receives one electronic component 4. Therefore, it should be understood that only a portion of the holder 8 is shown in FIG. 9.

The disc-shaped holder 8 is rotated. An electronic component 4 is put into a receiving cavity 5 at a predetermined position on a path along which the receiving cavity 5 is moved by the rotation of the holder 8. Subsequently, the electronic component 4 held in the receiving cavity 5 is moved between the first and second measuring terminals 9 and 10, and the first and second measuring terminals 9 and 10 come into contact with the first and second external terminal electrodes 2 and 3 to measure the electrical characteristic of the electronic component 4. After that, the electronic component 4 is ejected from the receiving cavity 5. In this case, electronic components 4 are sorted according to the measured electrical characteristic, for example, depending on whether the electrical characteristic is good.

When the electrostatic capacitance of the electronic component 4 is determined using the above-described characteristic measuring apparatus 1, in actuality, it is determined using the following procedure in order to increase the accuracy.

First, an electrical parasitic component given by electrical elements, such as the measuring terminals 9 and 10 and cables (not shown), provided in the characteristic measuring apparatus 1 is measured beforehand. Subsequently, the electrostatic capacitance of the electronic component 4 is measured. The measured electrostatic capacitance is a value including the electrical parasitic component. The value obtained by subtracting the electrical parasitic component from the measured electrostatic capacitance of the electronic component 4 is regarded as the electrostatic capacitance of the electronic component 4.

Therefore, when there is a difference between the electrical parasitic component measured beforehand and the electrical parasitic component obtained when the electronic component 4 is actually tested, the difference is included as an error in the measured electrostatic capacitance.

The above-described electrical parasitic component includes a stray capacitance between the measuring terminals 9 and 10. In FIG. 9, electric lines of force 11 that produce the stray capacitance are schematically shown by broken arrows. As the size of the electronic component 4 decreases and the distance between the first and second measuring terminals 9 and 10 thereby decreases, and as the opposing area between the first and second measuring terminals 9 and 10, the stray capacitance becomes less negligible.

When there are variations in the size of the electronic components 4 under such a condition, the stray capacitance varies because of the size variations. As a result, a difference is formed between the electrical parasitic component obtained when characteristic is measured and the electrical parasitic component measured beforehand, and the difference changes. An error produced thereby is included in the measured electrostatic capacitance.

A similar problem is also encountered not only when the electrostatic capacitance is measured, but also when other electrical characteristics are measured.

SUMMARY OF THE INVENTION

In order to overcome the problems described above, preferred embodiments of the present invention provide an electronic-component characteristic measuring apparatus that allows the electrical characteristic to be measured more precisely without experiencing the errors in measurement described above.

In brief, preferred embodiments of the present invention minimize the stray parasitic capacitance adjacent to an electronic component that is tested for measuring the electrical characteristic and to thereby minimize measurement error resulting from size variations of electronic components.

More specifically,-according to a preferred embodiment of the present invention, an electronic-component characteristic measuring apparatus for measuring an electrical characteristic of a chip-shaped electronic component having first and second external terminal electrodes at first and second opposing ends thereof, includes a holder having at least one receiving cavity for receiving the electronic component, and holding the electronic component with the first and second external terminal electrodes pointing toward first and second opposing open ends of the receiving cavity, and first and second measuring terminals disposed at the first and second open ends of the receiving cavity so as to come into contact with the first and second external terminal electrodes of the electronic component. In order to overcome the above-described technical problems, the electronic-component characteristic measuring apparatus has the following features.

That is, the holder has a shield layer including a conductive material and extending between the first and second measuring terminals, and the shield layer is electrically connected to a measurement reference potential.

By providing the holder with the shield layer, as described above, electric lines of force that cause stray capacitance are blocked by the shield layer near the electronic component, and therefore, the stray capacitance can be reduced.

In a preferred embodiment of the present invention, preferably, the holder has a plurality of receiving cavities each of which receives one electronic component, and the holder and the first and the second measuring terminals are movable relative to each other so that the first and second measuring terminals sequentially come into contact with the fist and second external terminal electrodes of the electronic components held in the receiving cavities. This makes it possible to efficiently perform the process for testing a plurality of electronic components for the electrical characteristic.

In the above-described preferred embodiment, preferably, the holder is shaped like a disk, the plurality of receiving cavities are distributed in a circumferential direction of the holder, and the first and second measuring terminals sequentially come into contact with the first and second external terminal electrodes of the electronic components held in the receiving cavities by the rotation of the holder. Accordingly, it is possible to successively perform the process for measuring the characteristic of the electronic components as the holder rotates in one direction.

In the above-described preferred embodiment, a plurality of the first and second measuring terminals may be distributed in the circumferential direction of the holder. According to this feature, measuring sections for measuring the electrical characteristic can be provided at a plurality of positions in the holder, and the process for measuring the electrical characteristic can be simultaneously performed at the measuring sections. When the same kind of electrical characteristic is measured at a plurality of measuring sections, the process for measuring the electrical characteristic can be efficiently performed. When different kinds of electrical characteristics are measured at a plurality of measuring sections, they can be measured in a state in which the electronic components are held in the holder.

In the above-described latter case in which a plurality of kinds of electrical characteristics are measured, preferably, the shield layer is divided into a plurality of sections distributed in the circumferential direction of the holder, and at least one of the receiving cavities is provided in each of the divided sections of the shield layer. This is because the measurement reference potentials applied to the plurality of sections of the shield layer can be different from each other according to the kind of the electrical characteristic to be measured.

In a case in which the holder and the first and second measuring terminals can move relative to each other, preferably, at least one of the first and second measuring terminals has a roller that rolls in contact with a corresponding one of the external terminal electrodes. This allows the measuring terminal to smoothly contact the external terminal electrodes.

In a case in which the holder and the first and second measuring terminals can move relative to each other, when the holder is movable, preferably, the holder has an exposed shield conductive surface electrically connected to the shield layer, and a shield terminal is further provided to be in contact with the shield conductive surface in order to apply the measurement reference potential. The measurement reference potential can be applied from the shield terminal to the shield layer through the shield conductive surface during the movement of the holder.

In the above-described preferred embodiment, when the shield conductive surface is formed of a portion of the shield layer, there is no need to provide a special shield conductive surface, and the structure of the holder can be prevented from being complicated.

As described above, according to various preferred embodiments of the present invention, the holder for measuring the electrical characteristic has the shield layer extending between the first and second measuring terminals. Since the shield layer is connected to the measurement reference potential, lines of electric force produced between the first and second measuring terminals can be blocked by the shield layer. For this reason, the stray parasitic capacitance between the first and second measuring terminals is minimized. As a result, it is possible to reduce measurement errors of the electrical characteristic resulting from the change in the stray capacitance due to size variations of the electronic components.

Therefore, the electrical characteristic of the electronic component can be measured with higher precision. As a result, the range in which non-defective electronic components are sorted according to the electrical characteristic can be widened, and an increase in the proportion of non-defective electronic components can be expected.

In preferred embodiments of the present invention, when the holder has a plurality of receiving cavities each of which receives one electronic component, and the holder and the first and second measuring terminals are movable relative to each other so that the first and second measuring terminals sequentially come into contact with the first and second external terminal electrodes of the electronic components held in the receiving cavities, the characteristic measuring process for a plurality of electronic components can be performed efficiently.

In the above-described case, when the holder is shaped like a disk, the receiving cavities are distributed in the circumferential direction of the holder, and the first and second measuring terminals sequentially come into contact with the first and second external terminal electrodes of the electronic components held in the receiving cavities by the rotation of the holder, a process for inserting the electronic components into the receiving cavities, a process for measuring the electrical characteristics of the electronic components in the receiving cavities, and a process for ejecting the electronic components from the receiving cavities can be successively performed while rotating the holder in one direction, and the characteristic measuring process can be performed more efficiently.

In the above-described case, the characteristic measuring process can be simultaneously performed at a plurality of positions by arranging and distributing the first and second measuring terminals in a plurality of pairs in the circumferential direction of the holder.

In the above-described case, when the shield layer is divided into a plurality of sections distributed in the circumferential direction of the holder, and at least one of the receiving cavities is provided in each of the divided sections of the shield layer, processes for measuring a plurality of kinds of electrical characteristics can be simultaneously performed while changing or varying the measurement reference potentials applied to the plurality of sections of the shield layer.

In a case in which the holder and the first and second measuring terminals are movable relative to each other, when at least one of the first and second measuring terminals has a roller that rolls in contact with a corresponding one of external terminal electrodes, a smooth contact state of the measuring terminal with the external terminal electrode can be achieved.

In a case in which the holder is movable, when the shield conductive surface electrically connected to the shield layer is exposed from the holder, the measurement reference potential can be applied to the shield layer, regardless of the movement of the holder, by putting the shield terminal into contact with the shield conductive surface.

Other features, elements, characteristics and advantages of the present invention will become more apparent form the following detailed description of preferred embodiments with reference to the attached drawings.

DETAILED DESCRIPTION OF PREFERRED EMBODIMENTS

Figure 1:
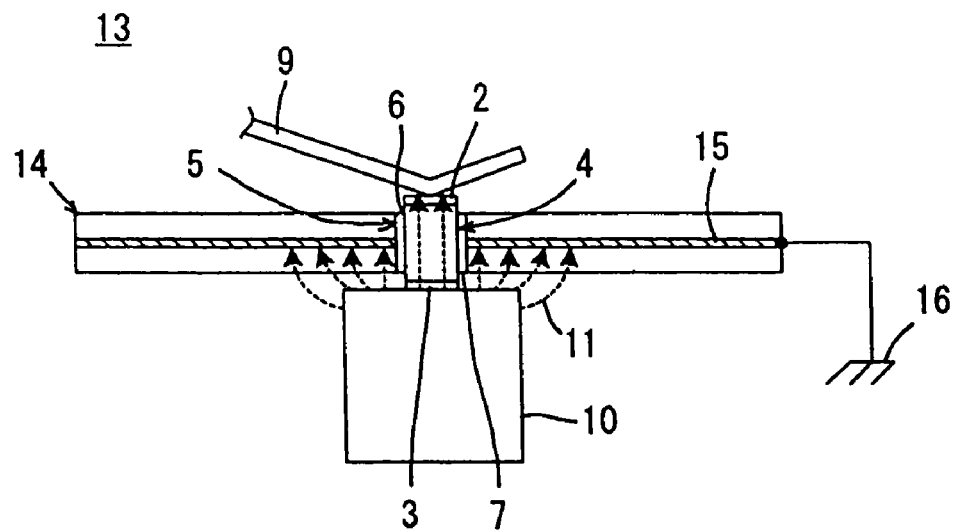
FIG. 1 is a cross-sectional view illustrating the principal portion of an electronic-component characteristic measuring apparatus 13 to explain the principles of preferred embodiments of the present invention.
Figure 9:
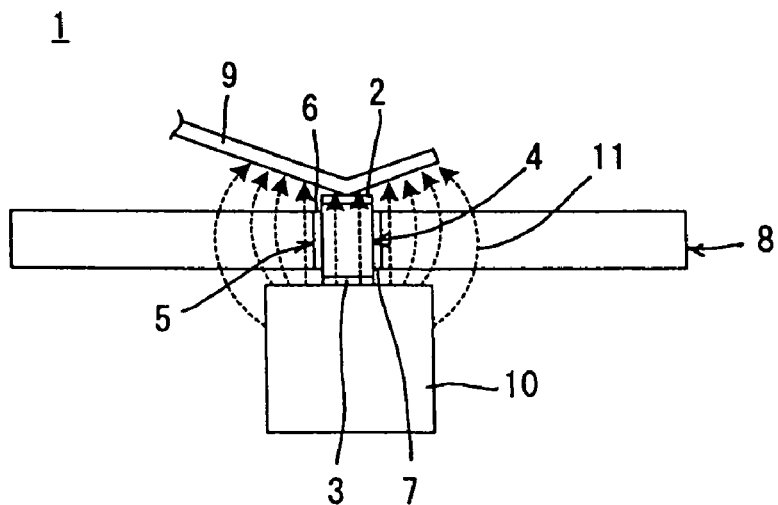
FIG. 9 is a cross-sectional view illustrating the principal portion of a known electronic-component characteristic measuring apparatus 1 that is relevant to preferred embodiments of the present invention.

FIG. 1 shows the principal portion of an electronic-component characteristic measuring apparatus 13 according to a preferred embodiment of the present invention in order to explain the principles of the invention, and corresponds to FIG. 9. In FIG. 1, elements corresponding to those in FIG. 9 are denoted by like reference numerals, and redundant descriptions thereof are omitted.

The characteristic measuring apparatus 13 shown in FIG. 1 is characterized in the structure of a holder 14 for holding an electronic component 4. That is, the holder 14 has a shield layer 15 made of a conductive material and extending between first and second measuring terminals 9 and 10. The shield layer 15 is electrically connected to a measurement reference potential 16.

In FIG. 1, electric lines of force 11 giving a stray capacitance are shown by broken arrows, in a manner similar to that in FIG. 9.

The electric lines of force 11 generated between the first and second measuring terminals 9 and 10 are blocked by the shield layer 15 so that only lines passing through the electronic component 4 remain. Therefore, the stray parasitic capacitance adjacent to the electronic component 4 is reduced. For this reason, the change of the stray capacitance due to size variations of the electronic component 4 is minimized. As a result, measurement errors of the electrical characteristic, such as electrostatic capacitance, can be further reduced.

A more specific preferred embodiment of the present invention will be described below.

Figure 2:
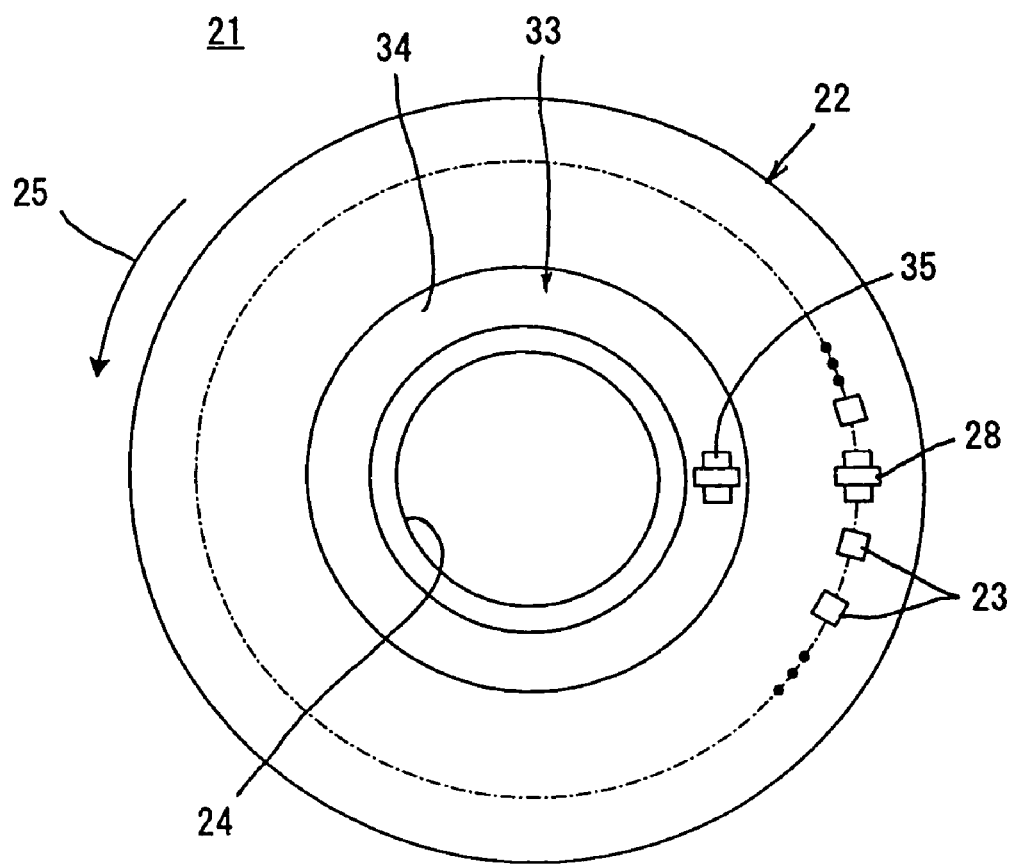
FIG. 2 is a plan view of a holder 22 provided, together with a first measuring terminal 28 and a shield terminal 35, in an electronic-component characteristic measuring apparatus 21 according to a first preferred embodiment of the present invention.
Figure 3:
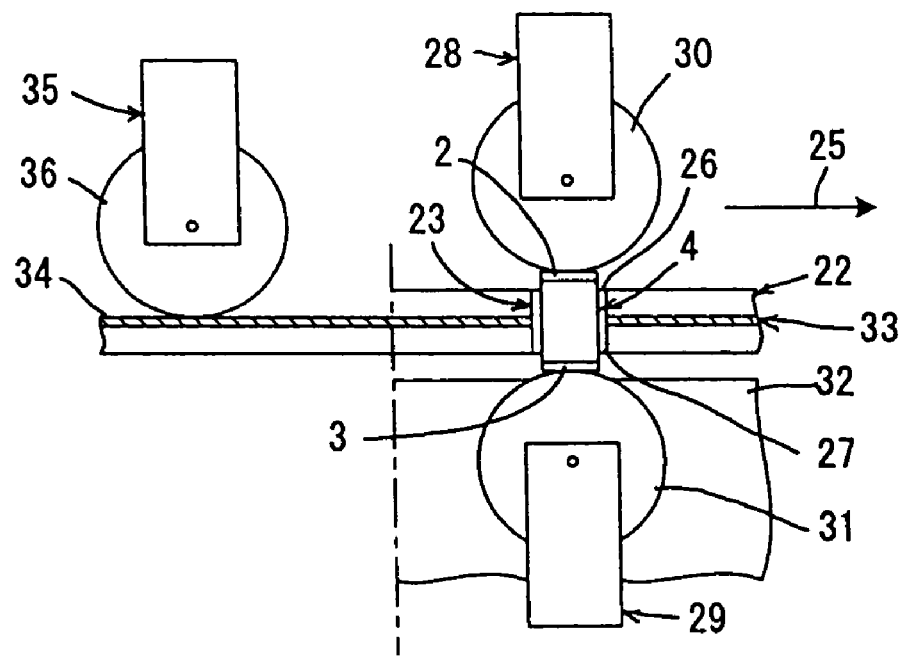
FIG. 3 includes an enlarged front view of the first and second measuring terminals 28 and 29 and the shield terminal 35 provided in the electronic-component characteristic measuring apparatus 21 shown in FIG. 2, and a partially enlarged sectional view of the holder 22.

FIGS. 2 and 3 show the principal portion of an electronic-component characteristic measuring apparatus 21 in order to explain a first preferred embodiment of the present invention. FIG. 2 is a plan view of a holder 22 provided in the characteristic measuring apparatus 21, and FIG. 13 is a partially enlarged sectional view of the holder 22.

The characteristic measuring apparatus 21 handles a chip-shaped electronic component 4 having first and second external terminal electrodes 2 and 3 provided, respectively, at first and second opposing ends thereof, in a manner similar to that in the electronic components 4 shown in FIGS. 1 and 9.

The holder 22 is preferably shaped like a disk, as shown in FIG. 2. The holder 22 includes a plurality of receiving cavities 23 each of which receives one electronic component 4. The plural receiving cavities 23 are distributed in the circumferential direction of the holder 22. Although not shown, the receiving cavities 23 may be arranged in a plurality of rows when necessary.

A shaft-receiving hole 24 is provided at the center of the holder 22. By the transmission of rotation of a shaft (not shown) received therein, the holder 22 is rotated, as shown by arrow 25. The holder 22 is intermittently rotated in normal cases.

An electronic component 4 is put into a receiving cavity 23 at a predetermined position on a path along which the receiving cavity 23 is moved by the above-described rotation of the holder 22. As shown in FIG. 3, the electronic component 4 is held in the receiving cavity 23 in a state in which the first and second external terminal electrodes 2 and 3 are disposed at first and second opposing open ends 26 and 27 of the receiving cavity 23.

The characteristic measuring apparatus 21 has first and second measuring terminals 28 and 29 that are disposed to be in contact with the first and second external terminal electrodes 2 and 3 of the electronic component 4 at the first and second open ends 26 and 27 of the receiving cavity 23. By the rotation of the holder 22, the first and second measuring terminals 28 and 29 sequentially come into contact with first and second external terminal electrodes 2 and 3 of electronic components 4 held in the receiving cavities 23. In this state, a process for testing the electronic components 4 for a desired electrical characteristic is carried out.

After the electronic components 4 are moved with the rotation of the holder 22, they are ejected from the receiving cavities 23. In this case, the electronic components 4 are sorted according to the measured electrical characteristic, for example, depending on whether the electrical characteristic is good.

In this preferred embodiment, the first and second measuring terminals 28 and 29 respectively have rollers 30 and 31 that roll in contact with the first and second external terminal electrodes 30 and 31. These rollers 30 and 31 permit smooth contact with the external terminal electrodes 2 and 3 of the electronic components 4 that move with the rotation of the holder 22.

As partly shown in FIG. 3, a fixed base 32 is provided below the holder 22 to receive the electronic components 4 held in the receiving cavities 4 so that the electronic components 4 will not fall off. The fixed base 32 is unnecessary when the receiving cavities 23 have a shape such as to prevent the electronic components 4 from falling off.

The holder 22 has a shield layer 33 extending between the first and second measuring terminals 28 and 29. The shield layer 33 preferably includes a conductive material such as copper, an alloy thereof, or other metals. For example, the total thickness of the holder 22 is set at approximately 500 µm, for example, and the thickness of the shield layer 33 is set at approximately 35 µm, for example, although the thicknesses vary depending on the size of the electronic components 4 to be handled.

A portion of the holder 22 other than the shield layer 33 includes an electrically insulating material. For example, the electrically insulating material includes resin such as glass epoxy resin or bakelite, or ceramic such as zirconia. It is particularly preferable to use glass epoxy resin, in consideration of durability, wear resistance, and cost of the holder 22.

A shield conductive surface 34 electrically connected to the shield layer 33 is provided on the inner peripheral side of the holder 22. In this preferred embodiment, the shield conductive surface 34 is a part of the shield layer 33. A shield terminal 35 is provided in contact with the shield conductive surface 34. A measurement reference potential is applied to the shield terminal 35. Therefore, the shield layer 33 is electrically connected to the measurement reference potential by the contact of the shield terminal 35 with the shield conductive surface 34.

In this preferred embodiment, the shield terminal 35 has a roller 36 that rolls in contact with the shield conductive surface 34. The roller 36 allows the shield terminal 35 to smoothly touch the shield conductive surface 34 that moves with the rotation of the holder 22.

In a case in which the shield conductive surface 34 is continuously provided in the circumferential direction of the holder 22, as shown in FIG. 2, the shield terminal 35 may be provided at an arbitrary position as long as it is in contact with the shield conductive surface 34.

As described above, in the characteristic measuring apparatus 21, electric lines of force generated between the first and second measuring terminals 28 and 29 are favorably blocked by the shield layer 33 so that only electric lines of force passing through the electronic component 4 remain. Therefore, the stray parasitic capacitance adjacent to the electronic component 4 is minimized. For this reason, measurement errors of the electrical characteristic due to size variations of the electronic components 4 can be prevented, and the electrical characteristic can be measured with high precision.

Various electrical characteristics may be measured. When the electronic components 4 are capacitors, besides the above-described electrostatic capacitance, an electrical characteristic such as insulation resistance can be measured. When the electronic components 4 are chip resistors, an electrical characteristic such as resistance can be measured. When the electronic components 4 are chip inductors, an electrical characteristic such as inductance can be measured.

Other preferred embodiments of the present invention will be described below.

Figure 4:
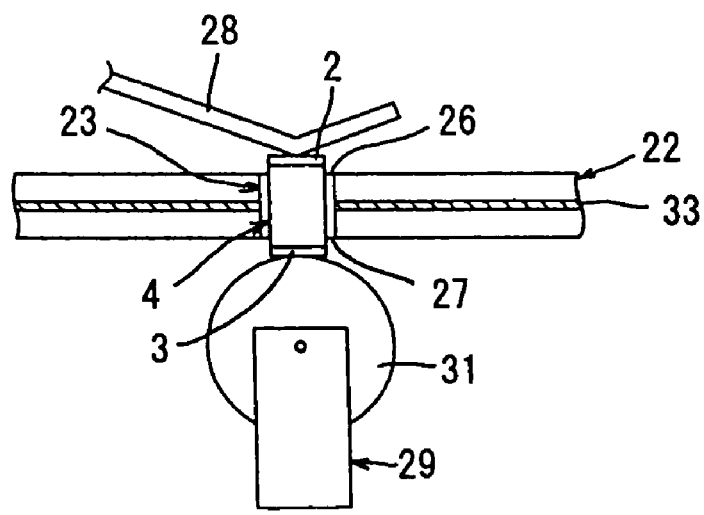
FIG. 4 includes an enlarged front view of first and second measuring terminals 28 and 29 and a partly enlarged view of a holder 22 to explain a second preferred embodiment of the present invention.
Figure 5:
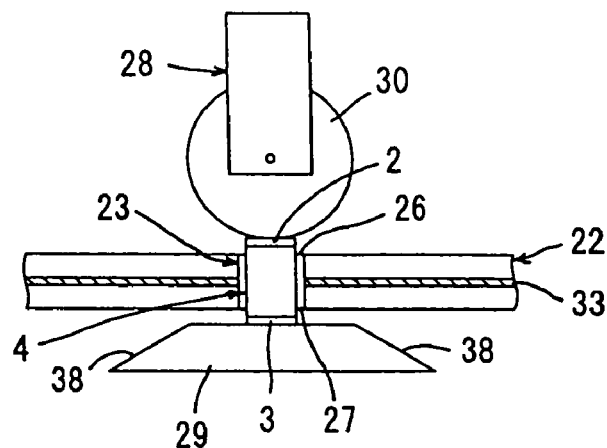
FIG. 5 is a view explaining a third preferred embodiment of the present invention, corresponding to FIG. 4.
Figure 6:
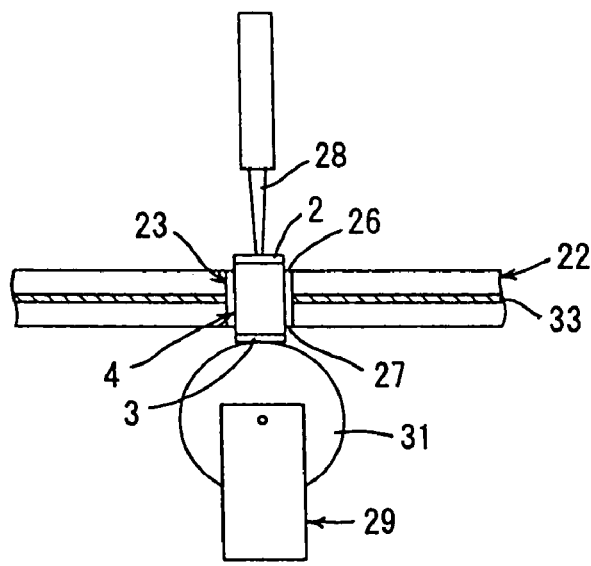
FIG. 6 is a view explaining a fourth preferred embodiment of the present invention, corresponding to FIG. 4.

FIGS. 4, 5, and 6 show modifications of measuring terminals in second, third, and fourth preferred embodiments of the present invention. In FIGS. 4 to 6, elements corresponding to those in FIG. 3 are denoted by like reference numerals, and redundant descriptions thereof are omitted.

In the second preferred embodiment shown in FIG. 4, a first measuring terminal 28 is preferably made of a leaf spring. Other structures are substantially similar to those in the first preferred embodiment.

As a modification of the second preferred embodiment shown in FIG. 4, a second measuring terminal 29 may be made of a leaf spring, and a first measuring terminal 28 may have a roller 30. Alternatively, both the first and second measuring terminals 28 and 29 may be made of a leaf spring.

In the third preferred embodiment shown in FIG. 5, a second measuring terminal 29 is preferably shaped like a block. Preferably, the block-shaped measuring terminal 29 has a tapered surface 38.

As a modification of the third preferred embodiment shown in FIG. 5, a first measuring terminal 28 may be shaped like a block and a second measuring terminal 29 may have a roller 31. Alternatively, both the first and second measuring terminals 28 and 29 may be shaped like a block.

In the fourth preferred embodiment shown in FIG. 6, a first measuring terminal 28 is preferably made of a pin probe.

As a modification of the fourth preferred embodiment shown in FIG. 6, a second measuring terminal 29 may be made of a pin probe, and a first measuring terminal 28 may have a roller 30. Alternatively, both the first and second measuring terminals 28 and 29 may be made of a pin probe.

Although not specifically shown, for example, a measuring terminal made of a leaf spring and a block-shaped measuring terminal may be combined, or a measuring terminal made of a pin probe and a block-shaped measuring terminal may be combined.

Figure 7:
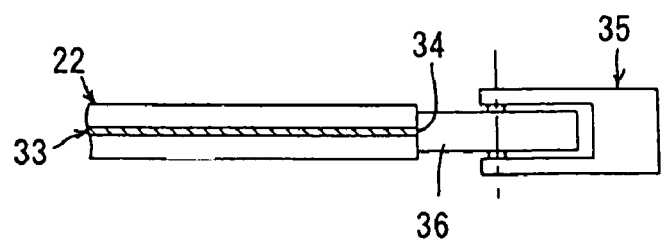
FIG. 7 includes an enlarged front view of a shield terminal 35 and an enlarged sectional view of an outer peripheral portion of a holder 22 to explain a fifth preferred embodiment of the present invention.

FIG. 7 illustrates a fifth preferred embodiment of the present invention. In FIG. 7, elements corresponding to those in FIG. 3 are denoted by like reference numerals, and redundant descriptions thereof are omitted.

FIG. 7 shows an outer peripheral portion of a holder 22 shaped like a disk. A shield conductive surface 34 electrically connected to a shield layer 33 is exposed on the outer peripheral surface of the holder 22. On the other hand, a shield terminal 35 is disposed in contact with the shield conductive surface 34 so that a roller 36 rolls in contact with the outer peripheral surface of the holder 22.

In a further example regarding the placement of the shield terminal 35, although not specifically shown, referring to FIG. 3, a shield conducive surface 34 may be provided on the lower side of the holder 22 and the shield terminal 35 may be disposed on the lower side of the holder 22.

In a further example regarding the shape of the shield terminal 35, the shield terminal 35 may be made of a leaf spring as the first measuring terminal 28 shown in FIG. 4 is, or may be shaped like a block as the second measuring terminal 29 shown in FIG. 5 is.

Figure 8:
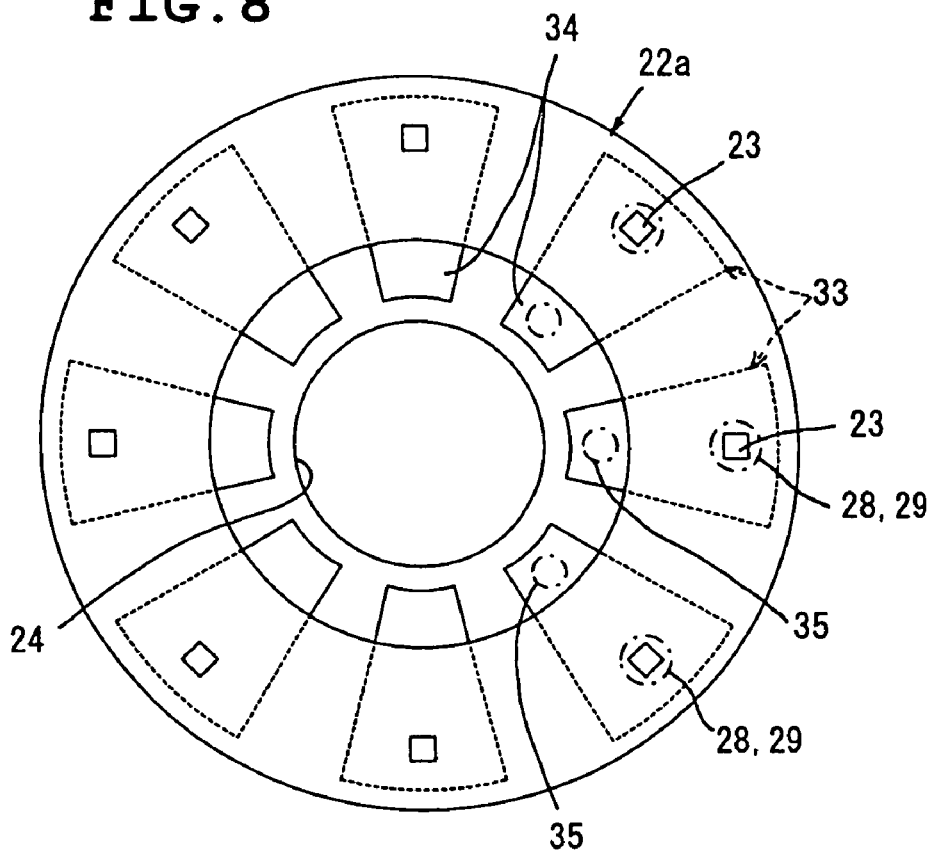
FIG. 8 is a plan view of a holder 22a to explain a sixth preferred embodiment of the present invention.

FIG. 8 is a plan view of a holder 22*a* to explain a sixth preferred embodiment of the present invention. In FIG. 8, elements corresponding to those in FIG. 2 are denoted by like reference numerals, and redundant descriptions thereof are omitted.

In the holder 22a shown in FIG. 8, a shield layer 33 is divided into a plurality of sections that are distributed in the circumferential direction of the holder 22a. At least one receiving cavity 23 is provided in each of the divided sections of the shield layer 33.

In this preferred embodiment, it is preferable that a plurality of pairs of first and second measuring terminals 28 and 29 (only the positions thereof are shown by one-dot chain circles) be distributed in the circumferential direction of the holder 22a. It is also preferable that shield terminals 35 be arranged corresponding to the pairs of first and second measuring terminals 28 and 29, as only the positions thereof are shown by one-dot chain circles.

In this preferred embodiment, a plurality of kinds of electrical characteristics of electronic components 4 can be measured while changing or varying the measurement reference potentials according to the kind of an electrical characteristic to be measured in a state in which the electronic components 4 are held in the holder 22a.

In a case in which a common measurement reference potential can be used to measure a plurality of kinds of electrical characteristics, the shield layer 33 does not need to be divided into a plurality of sections, as shown in FIG. 8, and a plurality of pairs of first and second measuring terminals 28 and 29 are distributed in the circumferential direction of the holder 22a. In this case, when a plurality of kinds of electrical characteristics are not measured, but the same kind of electrical characteristic is measured, such measurement of the electrical characteristic can be performed more efficiently.

While the present invention has been described above in conjunction with the illustrated preferred embodiments, various modifications are possible within the scope of the present invention.

For example, while the holders 22 and 22a are preferably shaped like a disk and are rotatable in the above illustrated embodiments, for example, the holders may be translatable.

When the holder has a plurality of receiving cavities, it is moved so that the first and second measuring terminals sequentially come into contact with the first and second external terminal electrodes of the electronic components held in the receiving cavities in the above-described preferred embodiments. Conversely, the first and second measuring terminals may be moved.

While the holders 22 and 22a are arranged so that the open ends 26 and 27 of the receiving cavities 23 point in the vertical direction in the preferred embodiments described above, the open ends 26 and 27 may point in the horizontal direction or the oblique direction.

The measurement reference potential is not always limited to a zero potential, and may be a specific potential depending on the electrical characteristic of the electronic components.

As described above, the electronic-component characteristic measuring apparatus of preferred embodiments of the present invention is suited to precisely test various electronic components.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

The invention claimed is:

1. An electronic-component characteristic measuring apparatus for measuring an electrical characteristic of a chip-shaped electronic component having first and second external terminal electrodes at first and second opposing ends thereof, the apparatus comprising:
   a holder having at least one receiving cavity for receiving the electronic component, and holding the electronic component with the first and second external terminal electrodes pointing toward first and second opposing open ends of the at least one receiving cavity;
   first and second measuring terminals disposed at the first and second open ends of the at least one receiving cavity so as to come into contact with the first and second external terminal electrodes of the electronic component; and
   a shield layer disposed within the holder and having first and second main surfaces, the shield layer including a conductive material and extending between the first and second measuring terminals; wherein
   the holder is made of an electrically insulating material; and
   both of the first and second main surfaces of the shield layer are sandwiched by the holder, such that the first and second main surfaces of the shield layer are not exposed toward the first and second measuring terminals.

2. An electronic-component characteristic measuring apparatus according to claim 1, wherein the holder has a plurality of receiving cavities each of which receives one electronic component, and the holder and the first and the second measuring terminals are movable relative to each other so that the first and second measuring terminals sequentially come into contact with the fist and second external terminal electrodes of the electronic components received in the receiving cavities.

3. An electronic-component characteristic measuring apparatus according to claim 2, wherein the holder has a disk shape, the plurality of receiving cavities are distributed in a circumferential direction of the holder, and the first and second measuring terminals sequentially come into contact with the first and second external terminal electrodes of the electronic components received in the receiving cavities by the rotation of the holder.

4. An electronic-component characteristic measuring apparatus according to claim 3, wherein a plurality of the first and second measuring terminals are distributed in the circumferential direction of the holder.

5. An electronic-component characteristic measuring apparatus according to claim 4, wherein the shield layer is divided into a plurality of sections distributed in the circumferential direction of the holder, and at least one of the receiving cavities is provided in each of the divided sections of the shield layer.

6. An electronic-component characteristic measuring apparatus according to claim 2, wherein at least one of the first and second measuring terminals has a roller that rolls in contact with a corresponding one of the external terminal electrodes.

7. An electronic-component characteristic measuring apparatus according to claim 6, wherein the holder has an exposed shield conductive surface electrically connected to the shield layer, and a shield terminal is arranged to be in contact with the shield conductive surface in order to apply the measurement reference potential.

8. An electronic-component characteristic measuring apparatus according to claim 7, wherein the shield conductive surface is a part of the shield layer.

9. An electronic-component characteristic measuring apparatus according to claim 2, wherein the holder has an exposed shield conductive surface electrically connected to the shield layer, and a shield terminal is further provided to be in contact with the shield conductive surface in order to apply the measurement reference potential.

10. An electronic-component characteristic measuring apparatus according to claim 9, wherein the shield conductive surface is a part of the shield layer.

11. An electronic-component characteristic measuring apparatus according to claim 1, wherein the holder has a disk shape.

12. An electronic-component characteristic measuring apparatus according to claim 1, wherein the holder includes a plurality of receiving cavities each capable of receiving at least one electronic component.

13. An electronic-component characteristic measuring apparatus according to claim 1, wherein the holder is rotatable.

14. An electronic-component characteristic measuring apparatus according to claim 1, wherein the first and second measuring terminals have rollers that roll in contact with the first and second external terminal electrodes.

15. An electronic-component characteristic measuring apparatus according to claim 1, wherein the first measuring terminal is made of a leaf spring.

16. An electronic-component characteristic measuring apparatus according to claim 15, wherein the second measuring terminal includes a roller.

17. An electronic-component characteristic measuring apparatus according to claim 1, wherein the first and second measuring terminals include leaf springs.

18. An electronic-component characteristic measuring apparatus according to claim 1, wherein at least one of the first and second measuring terminals has a block shape.

19. An electronic-component characteristic measuring apparatus according to claim 1, wherein the block shape has a tapered surface.

20. An electronic-component characteristic measuring apparatus according to claim 1, wherein at least one of the first and second measuring terminals includes a roller.

21. An electronic-component characteristic measuring apparatus according to claim 1, wherein at least one of the first and second measuring terminals includes a pin probe.

22. An electronic-component characteristic measuring apparatus according to claim 21, wherein at least one of the first and second measuring terminals includes a roller.

23. An electronic-component characteristic measuring apparatus according to claim 1, wherein the shield layer is electrically connected to a measurement reference potential.

24. An electronic-component characteristic measuring apparatus according to claim 1, wherein at least one of the first and second measuring terminals includes a contact surface having an area that is greater than an area of the first and second external terminal electrodes of the electronic component.

* * * * *